(12) United States Patent
Komine et al.

(10) Patent No.: US 9,368,413 B2
(45) Date of Patent: Jun. 14, 2016

(54) LIGHT EXPOSURE CONDITION ANALYSIS METHOD, NONTRANSITORY COMPUTER READABLE MEDIUM STORING A LIGHT EXPOSURE CONDITION ANALYSIS PROGRAM, AND MANUFACTURING METHOD FOR A SEMICONDUCTOR DEVICE

(71) Applicant: Kabushiki Kaisha Toshiba, Minato-ku (JP)

(72) Inventors: Nobuhiro Komine, Nagoya (JP); Yoshimitsu Kato, Yokkaichi (JP); Kazufumi Shiozawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/483,646

(22) Filed: Sep. 11, 2014

(65) Prior Publication Data

US 2016/0005661 A1 Jan. 7, 2016

(30) Foreign Application Priority Data

Jul. 2, 2014 (JP) ................................. 2014-136978

(51) Int. Cl.
| | | |
|---|---|---|
| H01L 27/14 | (2006.01) | |
| H01L 31/00 | (2006.01) | |
| H01L 21/66 | (2006.01) | |
| G01B 11/25 | (2006.01) | |

(52) U.S. Cl.
CPC ............... *H01L 22/12* (2013.01); *G01B 11/25* (2013.01)

(58) Field of Classification Search
CPC .............. H01L 21/02164; H01L 21/02326; H01L 21/02332; H01L 21/02345; H01L 21/02348; H01L 21/02351; H01L 21/02354; H01L 21/76264; H01L 27/14818; H01L 27/14825; H01L 29/765; H01L 31/0547; H01L 31/055; H01L 31/1125; H01S 3/005; H01S 3/034; H01S 3/0401; H01S 3/0637; H01S 3/094; H01S 3/225; H01S 5/222
USPC ......... 257/431, 290, 292, 293, 294, 432, 435, 257/436, 381, E31.099, E31.103, E31.106, 257/E21.006, E21.027, E21.134, E21.185, 257/E21.267, E21.278, E21.293, E21.32, 257/E21.328, E21.347; 438/31, 32, 308, 438/199
See application file for complete search history.

(56) References Cited

U.S. PATENT DOCUMENTS

| | | | |
|---|---|---|---|
| 817,454 A * | 4/1906 | yoshida ............... | B60B 17/0055 295/15 |
| 5,300,786 A | 4/1994 | Brunner et al. | |
| 6,674,511 B2 | 1/2004 | Nomura et al. | |
| 6,940,585 B2 * | 9/2005 | Nomura ............. | G03F 7/70641 355/55 |
| 7,272,304 B2 * | 9/2007 | Fukui ...................... | G03B 7/16 396/48 |

(Continued)

FOREIGN PATENT DOCUMENTS

| | | |
|---|---|---|
| JP | 2539163 | 10/1996 |
| JP | 2002-55435 | 2/2002 |

(Continued)

*Primary Examiner* — David Nhu
(74) *Attorney, Agent, or Firm* — Oblon, McClelland, Maier & Neustadt, L.L.P (57) ABSTRACT

According to one embodiment, a pattern formed through light exposure is observed under two or more different optical conditions, and a focus shift and exposure amount in the light exposure are estimated based on a brightness value of the pattern under each of the optical conditions.

9 Claims, 8 Drawing Sheets

(56) References Cited

U.S. PATENT DOCUMENTS

| | | |
|---|---|---|
| 7,678,513 B2 | 3/2010 | Nomura |
| 8,158,938 B2 * | 4/2012 | Miyamoto .............. H01J 37/21 250/306 |
| 8,343,693 B2 * | 1/2013 | Hirukawa .................. G03F 1/14 430/5 |
| 8,381,138 B2 * | 2/2013 | Matsunawa ............. G03F 7/705 716/51 |
| 8,885,950 B2 * | 11/2014 | Nagatomo ........... G06K 9/6203 382/218 |
| 2006/0019180 A1 | 1/2006 | Nomura |

FOREIGN PATENT DOCUMENTS

| | | |
|---|---|---|
| JP | 2006-39148 | 2/2006 |
| JP | 2006-303175 | 11/2006 |
| JP | 2011-40433 | 2/2011 |
| JP | 2011-040434 A | 2/2011 |
| JP | 2013-4672 | 1/2013 |
| JP | 2013-165134 | 8/2013 |

* cited by examiner

LIGHT EXPOSURE CONDITION ANALYSIS METHOD, NONTRANSITORY COMPUTER READABLE MEDIUM STORING A LIGHT EXPOSURE CONDITION ANALYSIS PROGRAM, AND MANUFACTURING METHOD FOR A SEMICONDUCTOR DEVICE

CROSS-REFERENCE TO RELATED APPLICATIONS

This application is based upon and claims the benefit of priority from Japanese Patent Application No. 2014-136978, filed on Jul. 2, 2014; the entire contents of which are incorporated herein by reference.

FIELD

Embodiments described herein relate generally to a light exposure condition analysis method, a nontransitory computer readable medium storing a light exposure condition analysis program, and a manufacturing method for a semiconductor device.

BACKGROUND

As circuit patterns for semiconductor devices have been finer, there has been an increasing demand for higher accuracy of a focus position in a lithography process.

DETAILED DESCRIPTION

According to one embodiment, a pattern formed through light exposure is observed under two or more different optical conditions, and a focus shift and exposure amount in the light exposure are estimated based on a brightness value of the pattern under each of the optical conditions.

Exemplary embodiments of a light exposure condition analysis device will be explained below in detail with reference to the accompanying drawings. The present invention is not limited to the following embodiments.

First Embodiment

Figure 1:
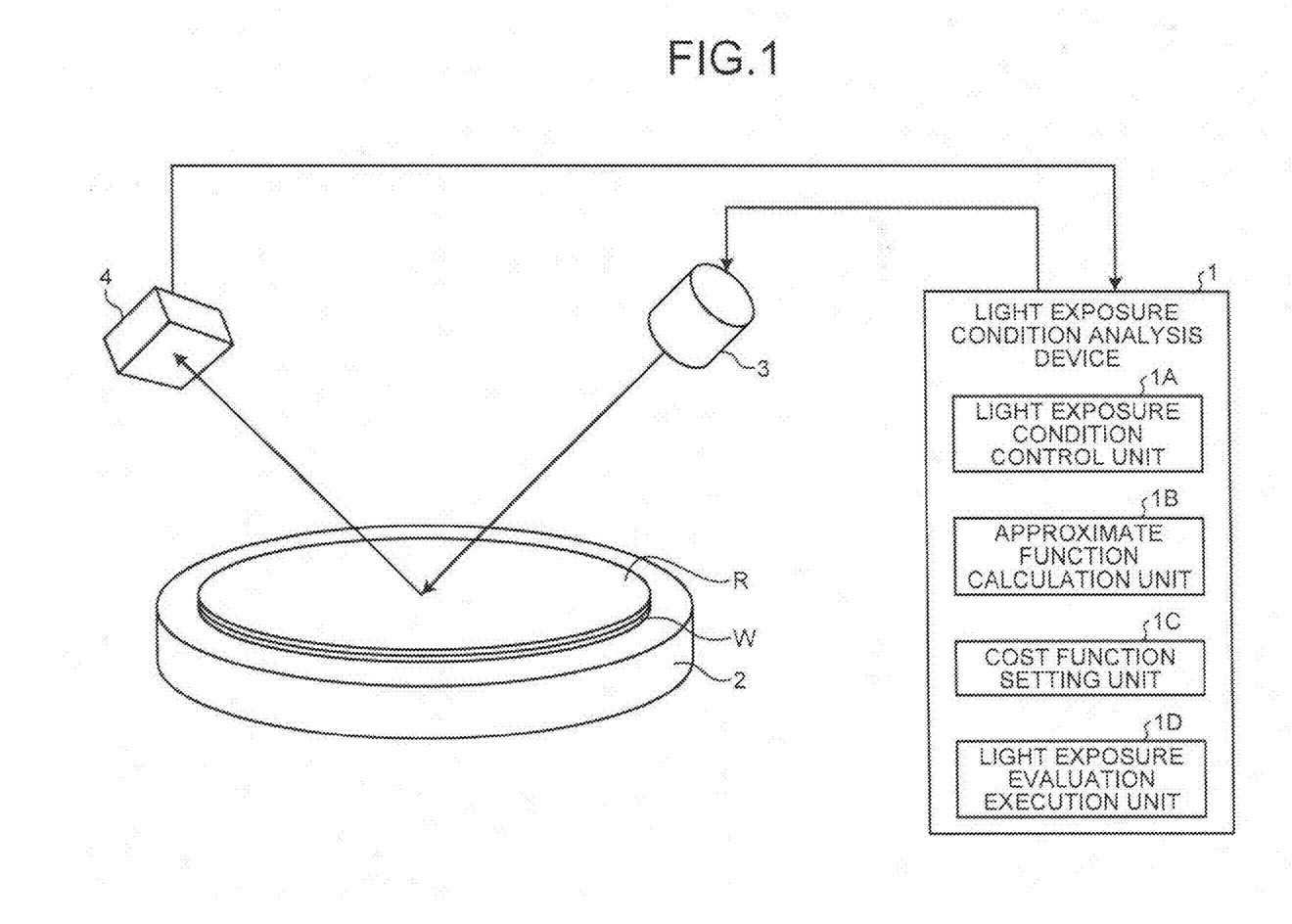
FIG. 1 is a schematic block diagram of a configuration of a light exposure condition analysis device according to a first embodiment.

FIG. 1 is a schematic block diagram of a configuration of a light exposure condition analysis device according to a first embodiment.

Figure 2:
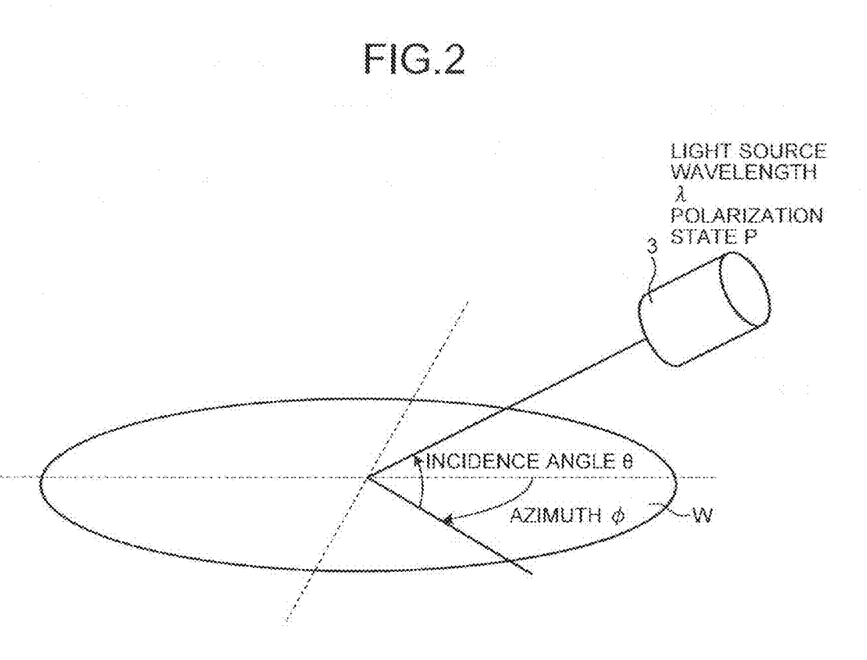
FIG. 2 is a perspective view of one example of optical conditions according to the first embodiment.

Referring to FIG. 1, a light exposure condition analysis device 1 can observe a pattern formed through light exposure under two or more different optical conditions, and estimate a focus shift and exposure amount in the light exposure, based on a brightness value of the pattern under each of the optical conditions. The light exposure condition analysis device 1 includes a wafer holder 2 that holds a wafer W, a light source 3 that generates inspection light, and a detector 4 that detects reflection light from the wafer W. The pattern may be a resist pattern R formed on the wafer W, for example. The optical conditions can be selected as at least one of wavelength $\lambda$ of the light source 3, polarization state P, incidence angle $\theta$ of light on the pattern, and incidence azimuth $\Phi$ of light on the pattern, as illustrated in FIG. 2. The detector 4 can use an imaging device such as a CCD or a CMOS.

The light exposure condition analysis device 1 is provided with a light exposure condition control unit 1A, an approximate function calculation unit 1B, a cost function setting unit 1C, and a light exposure evaluation execution unit 1D. The light exposure condition control unit 1A can control light exposure at formation of an adjustment pattern by changing at least one of a focus shift and exposure amount in each shot. The approximate function calculation unit 1B can calculate an approximate function with the focus shift and the exposure amount as variables under each of the optical conditions, based on a brightness value in each of the shots when the adjustment pattern is observed under two or more different optical conditions. The cost function setting unit 1C can calculate a cost function (or evaluation function) for the focus shift and the exposure amount, based on the brightness value and the approximate function given under each of the optical conditions. The cost function can be defined by the sum of differences between the brightness values and the approximate functions given under the optical conditions. At that time, weights may be assigned under each of the optical conditions. The light exposure evaluation execution unit 1D can estimate the focus shift and the exposure amount for a product pattern by evaluating the brightness value of the product pattern based on the cost function. The light exposure evaluation execution unit 1D can estimate the focus shift and the exposure amount with which the cost function becomes the smallest with changes made to the focus shift and the exposure amount, as the focus shift and the exposure amount for the product pattern.

Figure 3A:
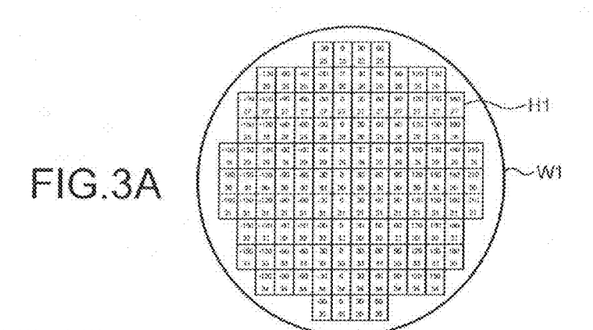
FIG. 3A is a planar view of a configuration example of an adjustment wafer for use in light exposure condition analysis according to the first embodiment.
Figure 3B:
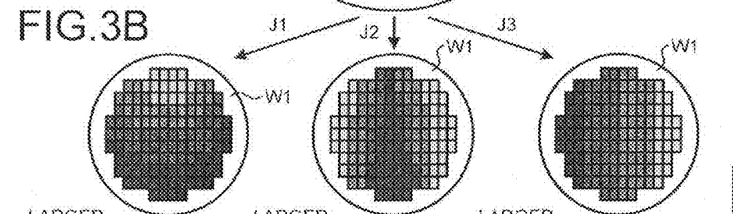
FIG. 3B is a planar view of brightness distribution of the adjustment wafer with changes made to the optical conditions according to the first embodiment.
Figures 3C, 3D, 3E:
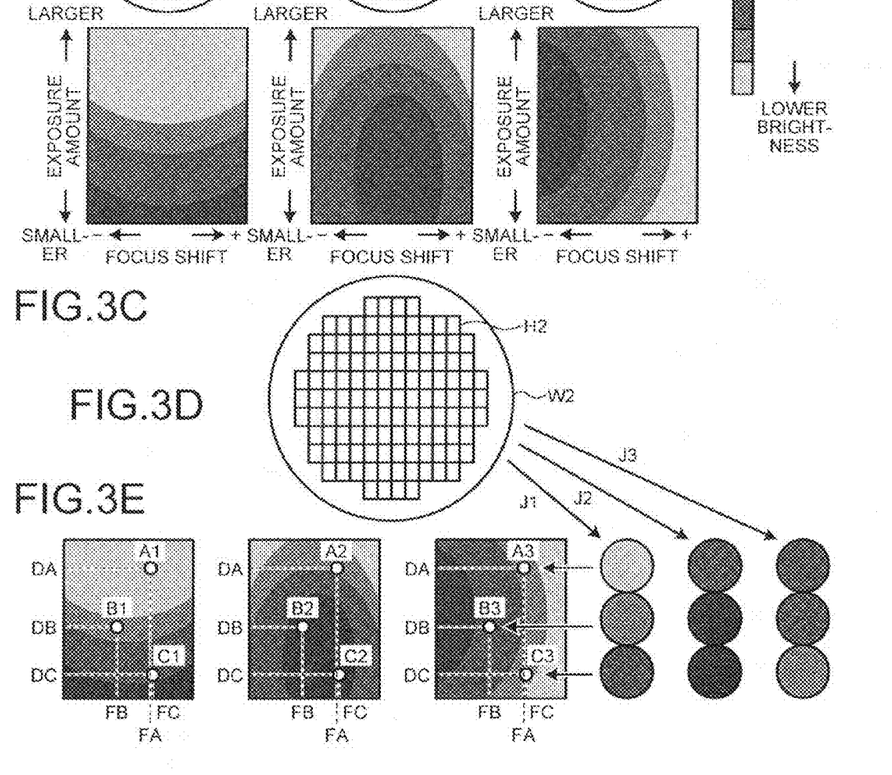
FIG. 3C is a diagram illustrating relationships among focus shifts and the amounts of light exposure and the brightness distribution of the adjustment wafer according to the first embodiment.
FIG. 3D is a planar view of a configuration example of a product wafer according to the first embodiment.
FIG. 3E is a diagram illustrating a method for estimating a focus shift and exposure amount with changes made to the optical conditions of the product wafer illustrated in FIG. 3D.

FIG. 3A is a planar view of a configuration example of an adjustment wafer for use in light exposure condition analysis according to the first embodiment, FIG. 3B is a planar view of brightness distribution of the adjustment wafer with changes made to the optical conditions according to the first embodiment, FIG. 3C is a diagram illustrating relationships among focus shifts and the amounts of light exposure and the brightness distribution of the adjustment wafer according to the first embodiment, FIG. 3D is a planar view of a configuration example of a product wafer according to the first embodiment, and FIG. 3E is a diagram illustrating a method for estimating a focus shift and exposure amount with changes made to the optical conditions of the product wafer illustrated in FIG. 3D.

Referring to FIG. 3A, on an adjustment wafer W1, the focus shift and the exposure amount are set for each shot H1. In FIG. 3A, the upper lines of the shots H1 indicate one example of the focus shift (nm), and the lower lines of the shots H1 indicate one example of exposure amount (mJ/cm$^2$). The adjustment wafer W1 can have a resist film formed thereon. In addition, after radiation of exposure light to the adjustment wafer W1, the resist film is developed to form an adjustment pattern on the adjustment wafer W1. The shape of the adjustment pattern on the adjustment wafer W1 can be equal to the shape of a product pattern on a product wafer W2.

The focus shift and the exposure amount set to the adjustment wafer W1 can take arbitrary values. However, the accuracy of focus decision can be expressed by the following equation, from measurement repeatability and focus sensitivity (the amount of brightness change at a focus step applied) of an investigation device used:

(Focus step)/(Focus sensitivity under applied measurement conditions)×(Measurement repeatability of the inspection device)

For example, it is assumed that some data is acquired about a wafer in one process, indicating that, with a 30-nm change in focus, the amount of a change in the brightness has a 30-step gradation, and the measurement repeatability of the inspection device is 3σ with a 5-step gradation. At that time, if the adjustment wafer is created with a focus step of 30 nm, the focus accuracy expected in this process is (30/10)×5=15 nm. Therefore, in the case where a focus accuracy of about 10 nm is required, the focus step for creation of the adjustment wafer can be set to 20 nm. In addition, an optimum step width can be determined for the exposure amount in the same manner.

Next, optical conditions J1 to J3 are set with a change made to at least one of the wavelength λ of the light source 3, the polarization state P, the incidence angle θ of light on the pattern, and the incidence azimuth Φ. Then, inspection light from the light source 3 is radiated to the adjustment wafer W1 under each of the optical conditions J1 to J3, and reflection light from the adjustment wafer W1 is detected by the detector 4, thereby to measure a brightness value in each of the shots H1 under each of the optical conditions J1 to J3 as illustrated in FIG. 3B. By changing the optical conditions J1 to J3, it is possible to change brightness distribution in each of the shots H1 on the adjustment wafer W1.

For the purpose of observing the states of the focus of the wafer and the exposure amount, it is desired that the measurement conditions under minimum influence of a lower layer underneath a photosensitive material forming the pattern. For example, if it is assumed that the absolute refraction index of the photosensitive material is designated as nr and the absolute refraction index of the lower layer film is designated as nu and the relationship nr>nu is established, a total reflection condition can be obtained by selecting the incidence angle θ satisfying sin θ nu/nr, which makes it possible to select the measurement condition under no influence of the lower layer film in principle. In the case of nr≤nu, extinction coefficient ku of the lower layer film can be determined in advance with each light source wavelength, and the light source wavelength with as large ku as possible can be selected to find the measurement condition under a small amount of influence of the lower layer.

Next, as illustrated in FIG. 3C, an approximate function with the focus shift and the exposure amount as variables is calculated under each of the optical conditions J1 to J3, based on the brightness value in each of the shots H1 when the adjustment pattern is observed under each of the optical conditions J1 to J3. The approximate function can be given by the equation K=f (F, D), where K denotes brightness, F denotes focus shift, and D denotes exposure amount. Then, the cost function T (F, D) is calculated for the focus shift and the exposure amount, based on the brightness value and the approximate function given under each of the optical conditions.

Next, as illustrated in FIG. 3D, a resist film is formed on the product wafer W2. Then, after radiation of exposure light to the product wafer W2, the resist film is developed to form a product pattern on the product wafer W2. On the product wafer W2, the focus shift and the exposure amount are equal in each of shots H2.

Next, as illustrated in FIG. 3E, inspection light is radiated from the light source 3 to the product wafer W2 under each of the optical conditions J1 to J3, and the reflection light is detected by the detector 4 to measure a brightness value under each of the optical conditions J1 to J3 with changes made to the focus shift and the exposure amount. Then, the brightness value of the product pattern is evaluated based on a cost function C (F, D) to estimate the focus shift and the exposure amount for the product pattern. For example, it is assumed that the values of the approximate function under the optical conditions J1 to J3 with the focus shift of FA and the exposure amount of DA are designated as A1 to A3, the values of the approximate functions under the optical conditions J1 to J3 with the focus shift of FB and the exposure amount of DB are designated as B1 to B3, and the values of the approximate function under the optical conditions J1 to J3 with the focus shift of FC and the exposure amount DC are designated as C1 to C3. At that time, a difference between the brightness value of the product wafer W2 and the value of the approximate function is calculated under each of the optical conditions J1 to J3, and the focus shift and the exposure amount with the smallest sum of the differences under the optical conditions J1 to J3 are estimated as the focus shift and the exposure amount for the product pattern.

By estimating the focus shift and the exposure amount from the brightness value of the pattern, it is possible to improve the accuracy of estimating the focus shift even in the case with sensitivity to exposure amount. Accordingly, even if dimension shifts occur in the circuit pattern with changes in the focus shift and the exposure amount, it is possible to prevent that the product is incorrectly moved as a conforming item to the next process.

Figure 4:
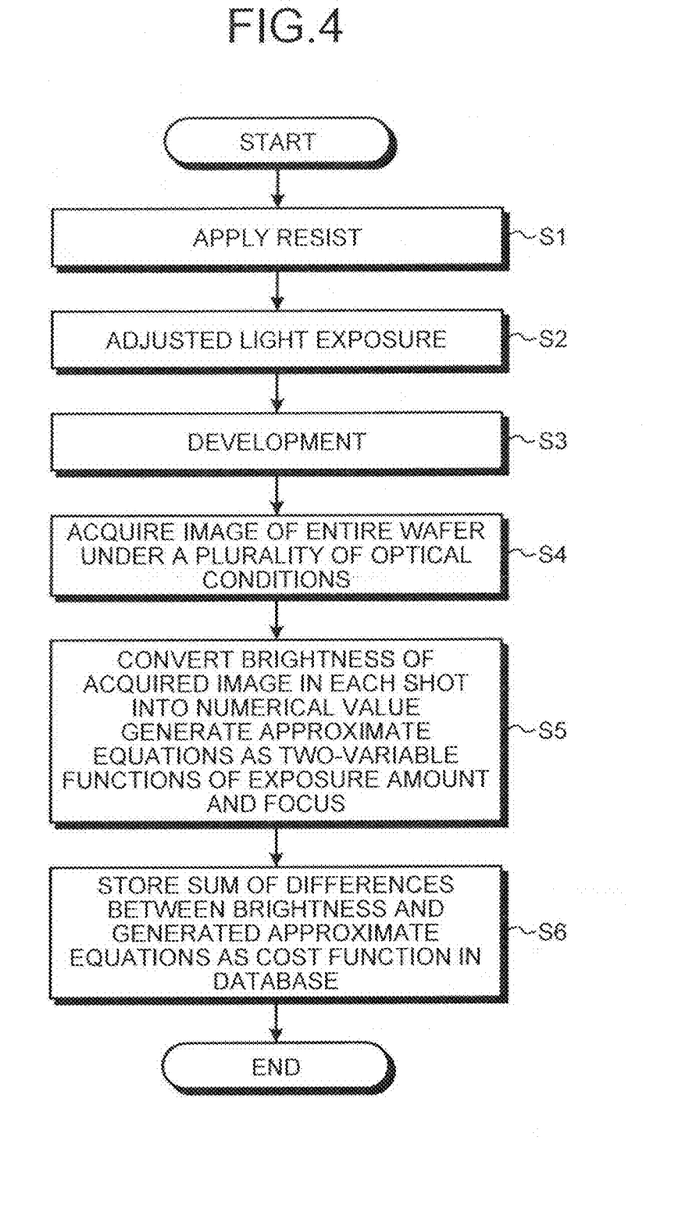
FIG. 4 is a flowchart of a method for calculating a cost function with the use of the adjustment wafer illustrated in FIG. 3A.

FIG. 4 is a flowchart of a method for calculating a cost function with the use of the adjustment wafer illustrated in FIG. 3A.

Referring to FIG. 4, a resist film is applied to the adjustment wafer W1 (S1). After exposure light is radiated to the adjustment wafer W1 (S2), the resist film is developed to form an adjustment pattern on the adjustment wafer W1 (S3). At that time, on the adjustment wafer W1, the focus shift and the exposure amount can be changed in each of the shots H1.

Next, an image of the entire adjustment wafer W1 is acquired under a plurality of optical conditions (S4). Then, based on the brightness value in each of the shots H1 of the image, an approximate function with the focus shift and the exposure amount as variables is calculated under each of the optical conditions (S5). On calculation of the approximate functions, the coefficient of a two-variable function with the focus shift and the exposure amount as variables can be determined with respect to the brightness value of the adjustment wafer W1. For example, an approximate function fk under optical conditions J can be given by the following equation:

$$fk(F,D) = k_1 + k_2F^2 + k_3FD + k_4D^2 + k_5F + k_6D$$

Then, a least-square method or the like can be used for each of the optical conditions J to determine a coefficients $k_1$ to $k_6$. The quadric function is used here as an approximate function, but cubic or higher function can be used instead.

Next, based on the brightness value and the approximate function given under each of the optical conditions, a cost function for the focus shift and the exposure amount is calculated and stored in a database (S6). If it is assumed that the brightness value under the optical condition J is designated as KJ (J=1, 2, ... n) (n is an integer of 2 or more), a cost function T (F, D) can be given by the following equation:

$$T(F,D) = (K1 - f1(F,D)) + (K2 - f2(F,D)) + \ldots + (Kn - fn(F,D))$$

The cost function T (F, D) may be weighted under each of the optical conditions as described below.

$$T(F,D) = \alpha 1(K1 - f1(F,D)) + \alpha 2(K2 - f2(F,D)) + \ldots + \alpha n(Kn - fn(F,D))$$

where $\alpha 1, \alpha 2, \ldots, \alpha n$ denote weights of the optical conditions.

Figure 5:
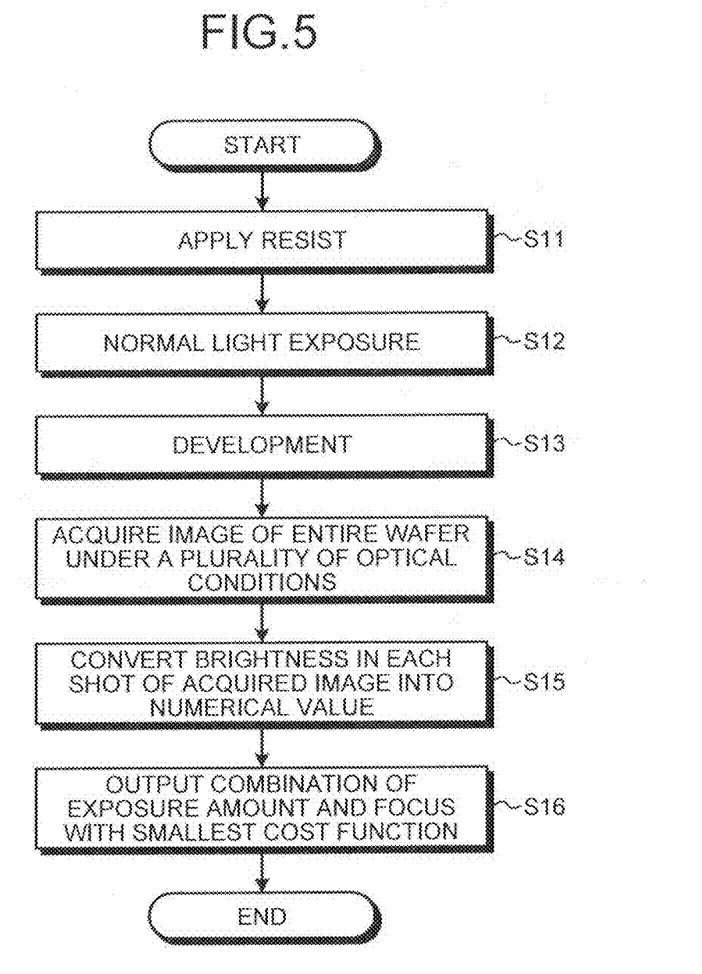
FIG. 5 is a flowchart of a method for estimating a focus shift and exposure amount of the product wafer illustrated in FIG. 3D.

FIG. 5 is a flowchart of a method for estimating a focus shift and exposure amount of the product wafer illustrated in FIG. 3D.

Referring to FIG. 5, a resist film is applied to the product wafer W2 (S11). After exposure light is radiated to the product wafer W2 (S12), the resist film is developed to form a product pattern on the product wafer W2 (S13).

Next, an image of the entire product wafer W2 is acquired under a plurality of optical conditions (S14). Then, a brightness value is calculated in each of the shots H2 of the image (S15). Next, a combination of a focus shift and exposure amount with which the cost function becomes smallest with changes made to the focus shift and the exposure amount is output (S16).

Second Embodiment

Figure 6:
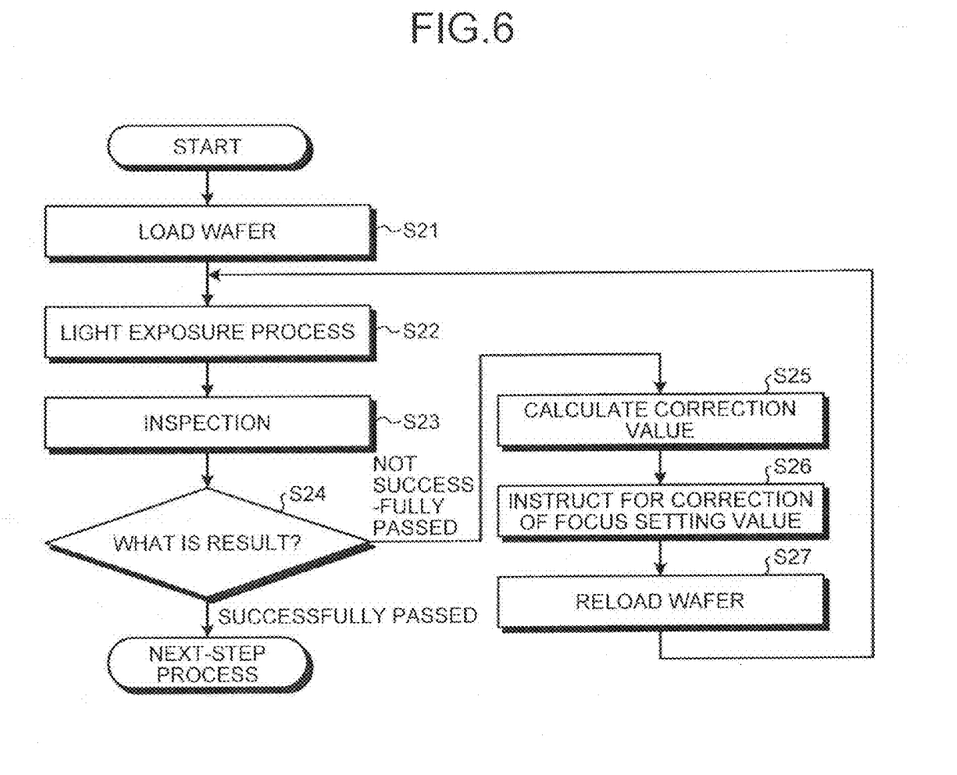
FIG. 6 is a flowchart of a method for light exposure to which a light exposure condition analysis method according to a second embodiment is applied.

FIG. 6 is a flowchart of a method for light exposure to which a light exposure condition analysis method according to a second embodiment is applied.

Referring to FIG. 6, the product wafer W2 with a resist film applied is loaded on the exposure device (S21). Then, the product wafer W2 is subjected to a light exposure process and then the resist film is developed to form a product pattern on the product wafer W2 (S22). Next, the steps S14 to S16 illustrated in FIG. 5 are performed to inspect the product pattern (S23). Then, when the product pattern has successfully passed as a result of the inspection (S24), the process proceeds to the next step. Meanwhile, when the product pattern has not successfully passed as a result of the inspection, a correction value for light exposure is calculated (S25), an instruction for correction of a focus setting value is issued (S26), and the product wafer W2 is reloaded on the exposure device (S27). On the re-loading, the product pattern formed at the previous step is separated from the product wafer W2, and a new resist film can be applied to the product wafer W2. Then, the process returns to S22 to repeat the steps S22 to S27 until the product wafer W2 passes the inspection. As a result of the inspection, the product wafer W2 can pass the inspection only when the focus shift falls within a predetermined range.

Third Embodiment

FIGS. 7A to 7D are cross-sectional views illustrating a method for manufacturing a semiconductor device according to a third embodiment.

Figure 7A:
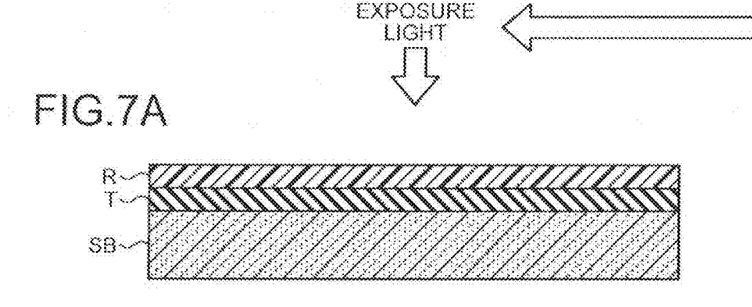
FIGS. 7A to 7D are cross-sectional views illustrating a method for manufacturing a semiconductor device according to a third embodiment.

Referring to FIG. 7A, a processed film T is formed on a foundation layer SB, and a resist film R is applied to the processed film T. The foundation layer SB and the processed film T may be a semiconductor substrate, an insulating film such as a silicon oxide film or a silicon nitride layer, a semiconductor film of amorphous silicon or polycrystalline silicon, or a metal film of Al or Cu. Exposure light such as ultraviolet rays is entered into the resist film R via a photomask to expose the resist film R to light.

Figure 7B:
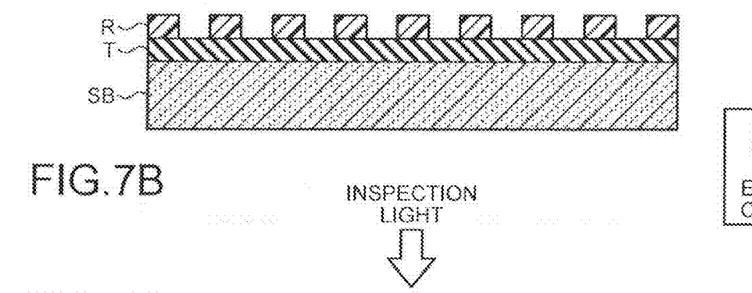
Figure 7C:
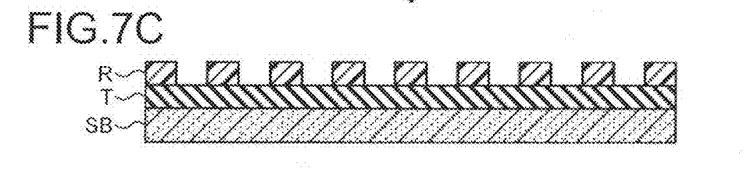
Figure 7D:
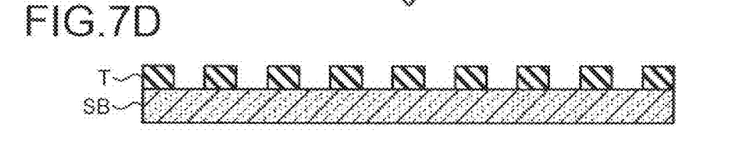

Next, as illustrated in FIG. 7B, the resist film R is developed to form a product pattern. Then, as illustrated in FIG. 7C, inspection light is radiated to the product pattern under a plurality of optical conditions, and the steps S14 to S16 illustrated in FIG. 5 are performed to inspect the product pattern. Then, when the product pattern has successfully passed as a result of the inspection, the processed film T is etched using the product pattern as a mask to transfer the product pattern to the processed film T as illustrated in FIG. 7D. Meanwhile, if the product pattern has not passed as a result of the inspection, the light exposure conditions are changed. Then, the product pattern formed at the previous process is separated from the processed film T, a new resist film is applied, and then the steps illustrated in FIG. 7A and the subsequent steps are performed.

Fourth Embodiment

Figure 8:
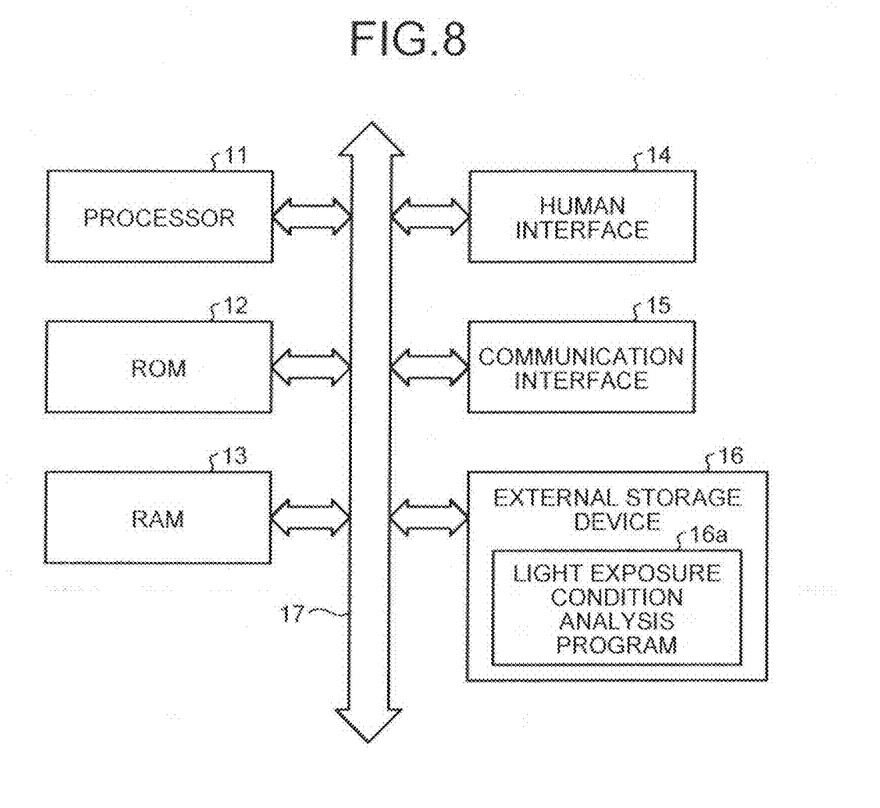
FIG. 8 is a block diagram illustrating a hardware configuration of a light exposure condition analysis device according to a fourth embodiment.

FIG. 8 is a block diagram illustrating a hardware configuration of a light exposure condition analysis device according to a fourth embodiment.

Referring to FIG. 8, the light exposure condition analysis device 1 can be provided with a processor 11 including a CPU and the like, a ROM 12 that stores fixed data, a RAM 13 that provides a work area and the like to the processor 11, a human interface 14 that intermediates between a human and a computer, a communication interface 15 that provides a means of external communication, and an external storage device 16 that stores programs for operating the processor 11 and various kinds of data. The processor 11, the ROM 12, the RAM 13, the human interface 14, the communication interface 15, and the external storage device 16 are connected together via a bus 17.

The external storage device 16 may be, for example, a magnetic disc such as a hard disc, an optical disc such as a DVD, a portable semiconductor storage device such as a USB memory or a memory card, or the like. The human interface 14 may be, for example, a keyboard, a mouse, or a touch panel as an input interface and a display or a printer as an output interface, or the like. The communication interface 15 may be, for example, an LAN card, a modem, or a router for connection with the Internet or an LAN, or the like. The external storage device 16 has a light exposure condition analysis program 16a installed therein for estimating a focus shift and an exposure amount in a light exposure.

When the light exposure condition analysis program 16a is executed by the processor 11, brightness values are acquired when a pattern formed through light exposure is observed under two or more optical conditions. Then, based on the brightness value under each of the optical conditions, a focus shift and exposure amount in the light exposure are estimated.

The light exposure condition analysis program 16a to be executed by the processor 11 may be stored in the external storage device 16 and then read to the RAM 13 at execution of the program, or may be stored in advance in the ROM 12, or may be acquired via the communication interface 15. In addition, the light exposure condition analysis program 16a may be executed on a stand-alone computer or a cloud computer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light exposure condition analysis method, comprising:
    observing a pattern formed through light exposure under two or more different optical conditions; and
    estimating a focus shift and exposure amount in the light exposure, based on a brightness value of the pattern under each of the different optical conditions;
    forming an adjustment pattern through the light exposure with a change made to at least one of the focus shift and the exposure amount in each of shots;
    observing the adjustment pattern under the different optical conditions;
    calculating an approximate function with the focus shift and the exposure amount as variables, based on the brightness value of the adjustment pattern in each of the shots; and
    calculating a cost function for the focus shift and the exposure amount, based on the brightness value and the approximate function given under each of the different optical conditions.

2. The light exposure condition analysis method according to claim 1, comprising evaluating a brightness value of a product pattern based on the cost function to estimate a focus shift and exposure amount for the product pattern.

3. The light exposure condition analysis method according to claim 2, comprising selecting a combination of a focus shift and exposure amount with which the cost function becomes the smallest with changes made to the focus shift and the exposure amount.

4. The light exposure condition analysis method according to claim 2, wherein the cost function is defined as the sum of differences between the brightness value and the approximate function given under each of the different optical conditions.

5. A light exposure condition analysis method, comprising:
    observing a pattern formed through light exposure under two or more different optical conditions; and
    estimating a focus shift and exposure amount in the light exposure, based on a brightness value of the pattern under each of the different optical conditions, wherein the pattern is a resist pattern formed on a wafer.

6. A nontransitory computer readable medium configured to store a light exposure condition analysis program that causes a computer to execute:
    acquiring a brightness value when a pattern formed through light exposure is observed under two or more different optical conditions; and
    estimating a focus shift and exposure amount in the light exposure, based on the brightness value under each of the different optical conditions;
    calculating an approximate function with the focus shift and the exposure amount as variables, based on the brightness value in each of shots when an adjustment pattern formed through the light exposure with a change made to at least one of the focus shift and the exposure amount in each of the shots is observed under the different optical conditions; and
    calculating a cost function for the focus shift and the exposure amount, based on the brightness value and the approximate function given under each of the different optical conditions.

7. The nontransitory computer readable medium according to claim 6 configured to store a light exposure condition analysis program that causes a computer to execute the step of evaluating a brightness value of a product pattern based on the cost function to estimate a focus shift and exposure amount for the product pattern.

8. The nontransitory computer readable medium according to claim 7 configured to store a light exposure condition analysis program that causes a computer to execute the step of selecting a combination of a focus shift and exposure amount with which the cost function becomes the smallest with changes made to the focus shift and the exposure amount.

9. The nontransitory computer readable medium according to claim 7, wherein the cost function is defined as the sum of differences between the brightness value and the approximate function given under each of the different optical conditions.

* * * * *